(12) United States Patent
Koprowski et al.

(10) Patent No.: US 6,671,838 B1
(45) Date of Patent: Dec. 30, 2003

(54) METHOD AND APPARATUS FOR PROGRAMMABLE LBIST CHANNEL WEIGHTING

(75) Inventors: Timothy J. Koprowski, Newburgh, NY (US); Mary P. Kusko, Hopewell Junction, NY (US); Lawrence K. Lange, Wappingers Falls, NY (US); Bryan J. Robbins, Poughkeepsie, NY (US)

(73) Assignee: International Business Machines Corporation, Armonk, NY (US)

( * ) Notice: Subject to any disclaimer, the term of this patent is extended or adjusted under 35 U.S.C. 154(b) by 456 days.

(21) Appl. No.: 09/671,413

(22) Filed: Sep. 27, 2000

(51) Int. Cl.[7] ............................ G11C 29/00; G11C 7/00; G01R 31/28; G01R 31/26
(52) U.S. Cl. ...................... 714/726; 714/718; 324/765; 365/201; 365/221
(58) Field of Search ................................ 714/724, 726, 714/718, 733, 739; 324/765; 371/27; 365/201, 221

(56) References Cited

U.S. PATENT DOCUMENTS

| | | | | |
|---|---|---|---|---|
| 5,323,400 A | * | 6/1994 | Agarwal et al. ............. | 714/728 |
| 5,369,648 A | * | 11/1994 | Nelson ........................ | 714/739 |
| 5,596,585 A | * | 1/1997 | Njinda et al. ................ | 714/733 |
| 5,612,963 A | * | 3/1997 | Koenemann et al. ....... | 714/739 |
| 5,925,144 A | | 7/1999 | Sebaa | |
| 5,930,270 A | | 7/1999 | Forlenza et al. | |
| 5,983,009 A | | 11/1999 | Lepejian et al. | |
| 5,983,380 A | * | 11/1999 | Motika et al. ............... | 714/733 |
| 6,012,157 A | | 1/2000 | Lu | |
| 6,041,429 A | * | 3/2000 | Koenemann ................. | 714/738 |
| 6,061,818 A | * | 5/2000 | Touba et al. ................. | 714/739 |
| 6,178,534 B1 | * | 1/2001 | Day et al. .................... | 714/745 |
| 6,314,540 B1 | * | 11/2001 | Huott et al. ................. | 714/738 |
| 6,327,685 B1 | * | 12/2001 | Koprowski et al. ......... | 714/733 |
| 6,393,594 B1 | * | 5/2002 | Anderson et al. ........... | 714/738 |
| 6,438,722 B1 | * | 8/2002 | Bailey et al. ................ | 714/736 |
| 6,442,720 B1 | * | 8/2002 | Koprowski et al. ......... | 714/726 |
| 6,442,723 B1 | * | 8/2002 | Koprowski et al. ......... | 714/732 |

OTHER PUBLICATIONS

*Maximization of Self–Test Coverage in a Hardware Design*, IBM Technical Disclosure Bulletin, Jun. 1992.
*Debug Capabilities for Logic Built–in Self Test*, 41189, IBM, Research Disclosure, Jul. 1998, p. 966.

* cited by examiner

Primary Examiner—Albert Decady
Assistant Examiner—Anthony T. Whittington
(74) Attorney, Agent, or Firm—Lynn Augspurger; Cantor Colburn LLP

(57) ABSTRACT

An exemplary embodiment of the invention is a built-in self-test (BIST) method and apparatus for testing the logic circuits on an integrated circuit. Random test pattern data is generated by a random pattern generator. A random resistant fault analysis (RRFA) program is used to determine the weighting requirements, on a per channel basis, for testing the logic circuits. The weighting requirements from the RRFA program are applied to the random test pattern data resulting in weighted test pattern data. The weighted test pattern data is then programmably applied to the scan chain.

11 Claims, 2 Drawing Sheets

METHOD AND APPARATUS FOR PROGRAMMABLE LBIST CHANNEL WEIGHTING

BACKGROUND OF THE INVENTION

The invention relates to testing integrated circuits, and, more particularly, to a method and apparatus for programmably selecting and applying weights, on a per channel basis, to test patterns within a logic built-in self-test (LBIST) structure.

Logic built-in self-test (LBIST) is used to test the integrated circuit logic of high-end servers and computers. LBIST is used at all levels of test including: integrated circuit, MCM, and system. Conceptually, the LBIST approach is based on the realization that much of a circuit tester's electronics is semi conductor-based, just like the devices under test, and that many of the challenges and limitations in testing lie in the interface to the Device Under Test (DUT). The LBIST approach can be described as an attempt to move many of the already semiconductor-based test equipment functions into the devices under test and eliminate the complex interfacing. One of the major advantages LBIST has over other means of testing logic is that the operation of the test is self-contained. All of the circuitry required to execute the test at-speed is contained within the integrated circuit. Very limited external controls are needed, so LBIST can be run at all levels of packaging (wafer, TCA, module and system) without requiring expensive external test equipment.

LBIST utilizes what is commonly referred to as Self-Test Using Multiple Signal Registers and Pseudo-Random Pattern Generators (STUMPS) architecture. The major components of LBIST include: a pseudo-random pattern generator (PRPG) used to generate the test patterns; a multiple input signature register (MISR) to compress the test results; and the self-test control macro (STCM) that is used to apply the clocks and controls to the PRPG, MISR and system logic to perform the test. The PRPG applies test data to the system logic via multiple parallel scan chains, which are connected between the PRPG and MISR.

One of the limitations of LBIST is the maximum achievable test coverage. Because the PRPG is implemented using a linear feedback shift register (LFSR) that generates random patterns (50% chance of being a 0 or a 1), certain random resistant structures are difficult, if not impossible, to test. Examples would be very wide AND gates or OR gates where the probability of all inputs being a 1 in the case of an AND or all inputs being a 0 in the case of an OR would be very small. Typically LBIST test coverage peaks at around 96%. The remaining faults must be tested by some other means of logic test, either weighted random pattern test (WRPT), deterministic test, or a combination of both.

Weighting is a technique where patterns can be biased towards a 0 or 1 state by ANDing or ORing multiple bits of an LFSR together. Instead of there being a 50% chance of a 0 or a 1, the odds of a 0 or 1 are weighted to increase the probability of one or the other occurring. For example, if 3 random bits are ORed together, the resultant output has a ⅞ chance of being a 1. Conversely, if 4 random bits are ANDed together, the output has a ¹⁄₁₆ chance of being a 1. This weighting technique can be used to test random resistant structures such as large AND or OR structures. A drawback in the current technology is that WRP and deterministic patterns must be applied from a tester and therefore they cannot be applied at higher levels of packaging.

Random resistant fault analysis (RRFA) programs provide users with information about the presence of clusters of faults in the circuit that are difficult to test with random patterns. Testers can use this information to determine the best way to improve random pattern testability. Typically, test data is weighted to account for fault clusters based on the output of the RRFA program.

A previous approach to weighting without the use of external testing equipment required the assignment of hard-coded weights (⅛, ¼, ½, ¾, ⅞, etc.) to the scan chains based on the weighting requirements. There are problems associated with this method of assigning weights. First, logic blocks must be pre-assigned to scan chains and typically, weight analysis is not completed early enough in the design process to make this assignment. Also, a single logic block may have two or more effective weight conditions. Assigning the logic block to a hard-coded weighted channel would only cover one of these effective weight conditions.

BRIEF SUMMARY OF THE INVENTION

An exemplary embodiment of the invention is a built-in self-test (BIST) method and apparatus for testing the logic circuits on an integrated circuit. Random test pattern data is generated by a random pattern generator. A random resistance fault analysis (RRFA) program is used to determine the weighting requirements, on a per channel basis, for testing the logic circuits. The weighting requirements from the RRFA program are applied to the random test pattern data resulting in weighted test pattern data. The weighted test pattern data is then programmably applied to the scan chain.

BRIEF DESCRIPTION OF THE DRAWINGS

Referring now to the drawings wherein like elements are numbered alike in the several FIGURES.

DETAILED DESCRIPTION OF THE PREFERRED EMBODIMENTS

Figure 1:
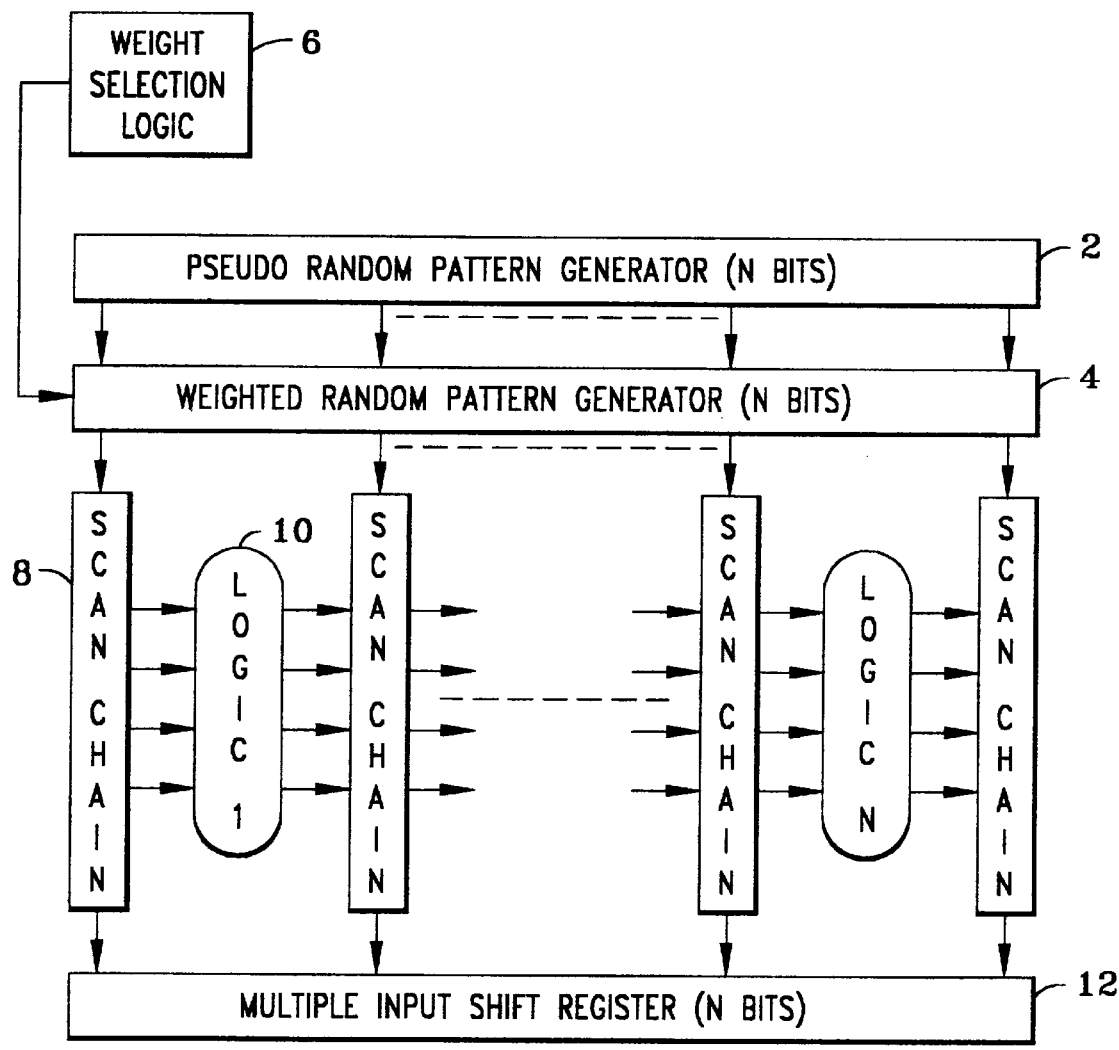
FIG. 1 illustrates schematically an overview of the LBIST structure containing the weighted random pattern generator (WRPG) and the random resistance fault analysis (RRFA) program.

FIG. 1 depicts an exemplary high-level overview of the LBIST implementation for weighted LBIST testing of the entire integrated circuit logic. Weight selection logic 6 selects the weights applied to each scan chain 8 in order to test each logic block 10. The weight selection logic 6 operates in response to random resistance fault analysis (RRFA). During the RRFA analysis, random patterns and weighted random patterns are applied to the logic block inputs. The number of faults detected by each weight application is recorded on a per-logic block basis. Once the logic blocks are connected together in scan chains, the total number of detected faults is calculated for each weight condition per scan chain. The weight detecting the highest number of faults is selected for each scan chain and applied during the weighted LBIST run. This approach can be extended for multiple weighted LBIST runs by selecting the second most effective weight per scan chain and so forth.

The weighted random pattern generator (WRPG) 4 receives a selection signal from the weight selection logic 6 to select weights to be applied to the random test data generated by the pseudo random pattern generator (PRPG) 2. The output of the WRPG 4 is random test pattern data that is weighted towards a 0 or towards a 1. The test patterns are passed through a scan chain 8, through the integrated circuit logic 10 and then to the multiple input shift register (MISR)

12 which compresses the test results. A state machine within each integrated circuit, referred to as the self-test control macro (STCM), not shown, is used to control internal-test-mode signals and the sequencing of all test and system clocks while in test mode.

Figure 2:
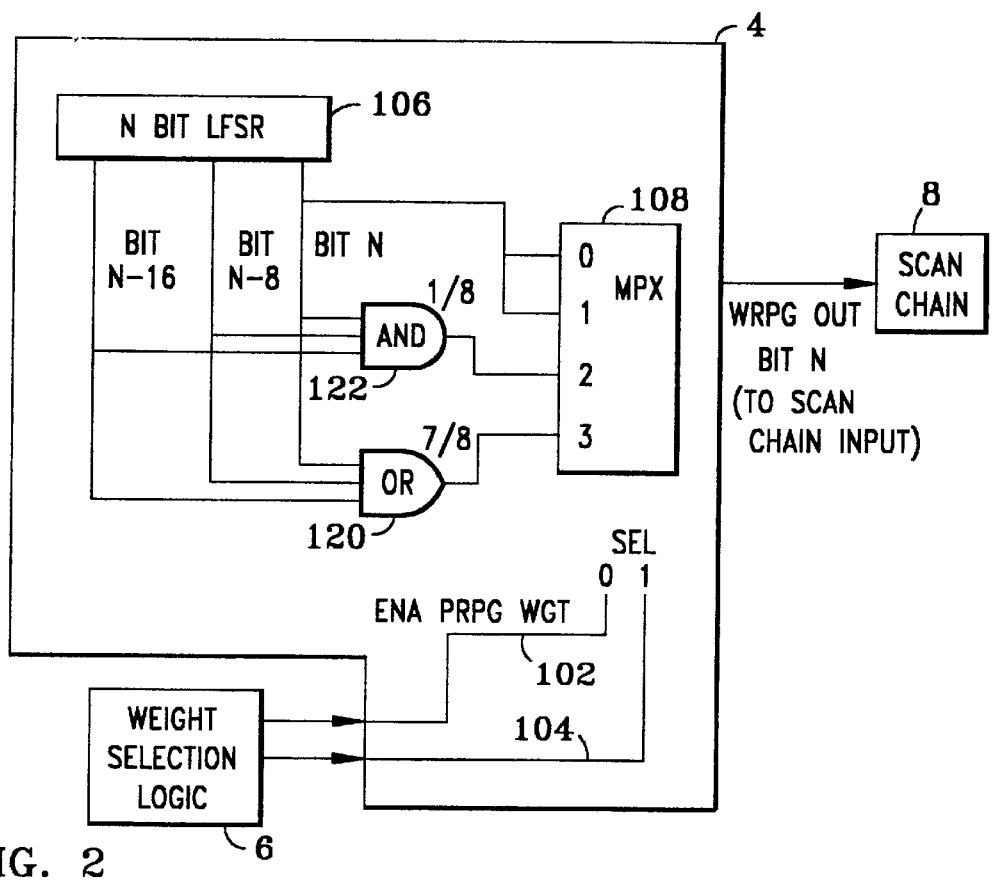
FIG. 2 illustrates an LBIST implementation with programmable per-channel weights.

FIG. 2 shows an exemplary LBIST implementation with programmable per-channel weights for a three bit weighting scheme. It depicts the wiring within the WRPG 4 that enables the weighting. In this implementation, one bit 102 (labeled ena_prpg_wgt) from the weight selection logic 6 is used to enable weighting on all channels. As shown in FIG. 2, the weight selection logic 6 provides input to a two bit multiplexer 108. If bit 102 is 0, then this causes multiplexer 108 to select either input 0 or input 1. Both input 0 and input 1 to the multiplexer 108 receive un-weighted patterns from the bit N from the N bit LFSR 106. The value of bit 102 can be either 0 if weighting should be turned off or 1 if weighting should be applied.

The second bit 104 output by the weight selection logic 6 controls the weight selection. If bit 102 is 1 and bit 104 is 0, then ⅛ weighting is selected. This is accomplished by multiplexer 108 selecting input 2 which is coupled to AND gate 122. The AND gate 122 receives three bits from the LFSR 106, namely bits N, N-8 and N-16. If bit 102 is 1 and bit 104 is 1, then ⅞ weighting is selected. This is accomplished by multiplexer 108 selecting input 3 which is coupled to OR gate 120. The OR gate 120 receives three bits from the LFSR 106, namely bits N, N-8 and N-16. It is understood that other weighting schemes may be used through different sized AND and OR gates and more weighting options can be selected with a larger multiplexer 108. The output of the WRPG 4, from multiplexer 108, is input into the scan chain 8.

Figure 3:
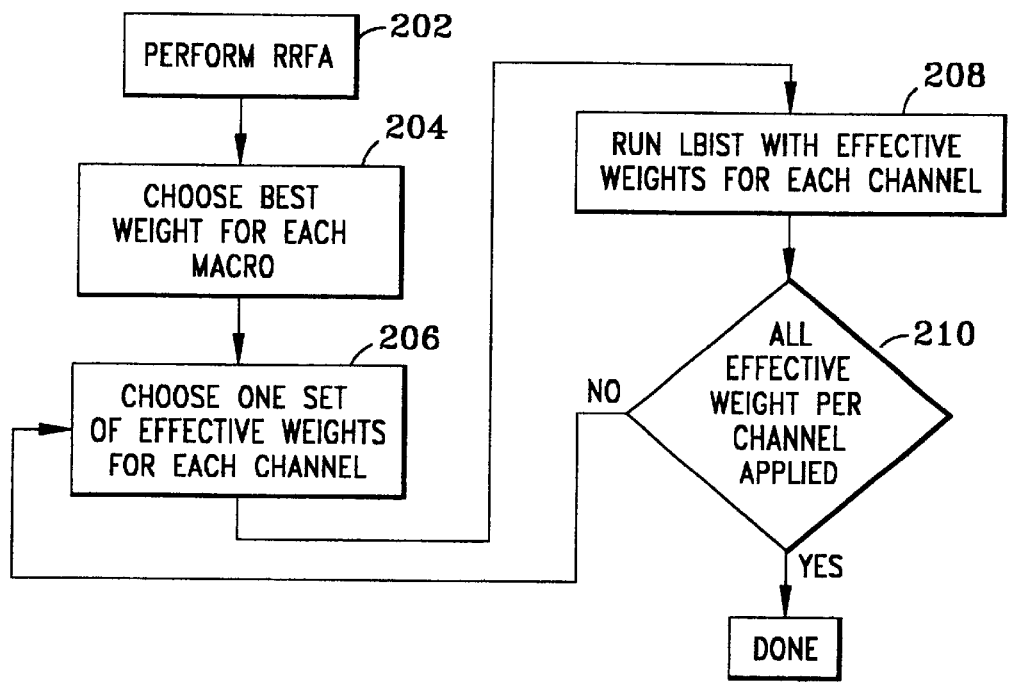
FIG. 3 depicts the overall flow of the weighted LBIST testing.

FIG. 3 depicts the overall flow of the weighted LBIST testing. First the RRFA program is run at step 202. The RRFA program performs LBIST simulations, using various weights, on each logic block 10 and records the number of faults detected for each weight value of each logic block 10. Next, the RRFA selects a set of weight values for each logic block 10 at step 204 by determining which weight(s) detected the most faults in the previous step 202. In addition, other sets of weight values may be selected to test specific portions of the logic. Thus, the invention allows multiple sets of weight values to be used for each macro. One of the effective set of weights is then chosen for each channel at step 206. The LBIST is then run with this set of weights for each channel at step 208. The previous two steps, 206 and 208, are repeated for all the sets of weights for each channel as determined at 210. When all effective weights have been applied the LBIST test is done.

As depicted in FIG. 3, this invention allows multiple LBIST tests to be run with different weights per channel in order to cover all of the effective weight conditions without the use of external test equipment. This overcomes the drawback of the current technology of only allowing each logic block to have one effective weight condition. The ability to run several iterations of the test using different effective weights allows the logic to be tested more thoroughly.

While preferred embodiments have been shown and described, various modifications and substitutions may be made thereto without departing from the spirit and scope of the invention. Accordingly, it is to be understood that the present invention has been described by way of illustration and not limitation.

What is claimed is:

1. A method of testing an integrated circuit comprising logic circuits connected to a scan chain and a built in self-test circuit for testing said logic circuits, the method comprising:

creating test pattern data for testing said integrated circuit by using a random pattern generator;

using a random resistant fault analysis program to determine weighting requirements for testing a portion of said integrated circuit, said random resistant fault analysis program applying random patterns, to logic blocks and determining a number of faults per logic block for each random pattern, said weighting requirements determined in response to the number of faults per logic block for each random pattern;

creating per channel weighting data based on said weighting requirements;

generating weighted test pattern data in response to said test pattern data and said per channel weighting data; and, programmably applying said weighted test pattern data to the scan chain.

2. The method as recited in claim 1, wherein each channel may have more than one set of said per channel weighting data.

3. The method as recited in claim 1, wherein each channel may have more than one set of said weighted test pattern data.

4. The method as recited in claim 1, wherein said weighted test pattern data is applied to each scan chain more than once.

5. The method as recited in claim 1, wherein said weighting requirements are one of ⅞, ½ or ⅛.

6. An integrated circuit, comprising logic circuits connected to a scan chain and self-test circuits for testing said logic circuits, said self-test circuits comprising:

a random pattern generator for generating at least one random test pattern;

a weighting circuit for applying said weighting requirements to said random test pattern resulting in a weighted random test pattern;

a selection circuit responsive to random resistant fault analysis and providing said weighted random test pattern to said scan chain for scanning said weighted pattern to said logic circuits, said random resistant fault analysis applying random patterns to logic blocks and determining a number of faults per logic block for each random pattern, said weighting requirements determined in response to the number of faults per logic block for each random pattern.

7. The apparatus as recited in claim 6, wherein each channel may have more than one set of said per channel weighting data.

8. The apparatus as recited in claim 6, wherein each channel may have more than one set of said weighted test pattern data.

9. The apparatus as recited in claim 6, wherein said weighted test pattern data is applied to each scan chain more than once.

10. The method as recited in claim 1, wherein said weighting requirements are determined in response said random pattern generating a highest number of faults per logic block.

11. The apparatus as recited in claim 6, wherein said weighting requirements are determined in response said random pattern generating a highest number of faults per logic block.

* * * * *